(12) United States Patent
Egbe et al.

(10) Patent No.: US 7,687,447 B2
(45) Date of Patent: Mar. 30, 2010

(54) SEMI-AQUEOUS STRIPPING AND CLEANING COMPOSITION CONTAINING AMINOBENZENESULFONIC ACID

(75) Inventors: Matthew I. Egbe, West Norriton, PA (US); Michael Walter Legenza, Bellingham, MA (US); Dana L. Durham, Pittstown, NJ (US)

(73) Assignee: Air Products and Chemicals, Inc., Allentown, PA (US)

( * ) Notice: Subject to any disclaimer, the term of this patent is extended or adjusted under 35 U.S.C. 154(b) by 94 days.

(21) Appl. No.: 12/047,655

(22) Filed: Mar. 13, 2008

(65) Prior Publication Data

US 2009/0233827 A1    Sep. 17, 2009

(51) Int. Cl.
    *C11D 7/50*    (2006.01)
(52) U.S. Cl. ........................................ 510/175; 134/1.3
(58) Field of Classification Search ................. 510/175; 134/1.3
    See application file for complete search history.

(56) References Cited

U.S. PATENT DOCUMENTS

| | | | |
|---|---|---|---|
| 3,653,931 A | 4/1972 | Borchert | |
| 4,165,295 A | 8/1979 | Vander Mey | |
| 4,199,483 A | 4/1980 | Jones | |
| 4,215,005 A | 7/1980 | Vander Mey | |
| 4,242,218 A | 12/1980 | Vander Mey | |
| 4,321,166 A | 3/1982 | McGrady | |
| 5,245,001 A * | 9/1993 | Furuhashi et al. | 528/171 |
| 5,534,177 A | 7/1996 | Mayhan | |
| 5,972,862 A | 10/1999 | Torii | |
| 6,232,283 B1 | 5/2001 | Inoue | |
| 6,432,185 B1 * | 8/2002 | Bauer et al. | 106/31.48 |
| 6,943,142 B2 | 9/2005 | Egbe | |
| 7,247,566 B2 | 7/2007 | Carter | |
| 2003/0060372 A1 * | 3/2003 | Fan et al. | 507/117 |
| 2005/0090109 A1 * | 4/2005 | Carter et al. | 438/692 |
| 2006/0014656 A1 * | 1/2006 | Egbe et al. | 510/175 |

* cited by examiner

*Primary Examiner*—Gregory E Webb
(74) *Attorney, Agent, or Firm*—Lina Yang

(57) ABSTRACT

The present invention relates to semi-aqueous compositions and the method using same, to remove highly cross-linked resists and etch-residues. The compositions are comprised of aminobenzenesulfonic acid, water miscible organic solvent and water.

20 Claims, No Drawings

SEMI-AQUEOUS STRIPPING AND CLEANING COMPOSITION CONTAINING AMINOBENZENESULFONIC ACID

BACKGROUND OF THE INVENTION

In the manufacture of semiconductors or semiconductor microcircuits it is necessary to remove materials from the surface of the substrate of the semiconductor device. In some instances the materials to be removed are polymeric compositions referred to as photoresists. In other instances the materials to be removed are residues of etching or ashing processes or simply contaminants. The purpose of stripping and/or cleaning compositions is to remove unwanted materials from a semiconductor substrate without corroding, dissolving or dulling the exposed surface of the substrate.

The art contains numerous references to compositions of different types for use in stripping photoresist and/or cleaning etch residue, ash or other contaminants from semiconductor substrates.

Patents in this technological field include U.S. Pat. No. 5,972,862 to Torii, U.S. Pat. No. 6,232,283 B1 to Inoue, U.S. Pat. No. 5,534,177 to Mayhan, U.S. Pat. No. 4,321,166 to McGrady, U.S. Pat. No. 4,199,483 to Jones, U.S. Pat. No. 3,653,931 to Borchert, U.S. Pat. No. 4,215,005, U.S. Pat. No. 4,165,295 and U.S. Pat. No. 4,242,218 to Mey.

BRIEF SUMMARY OF THE INVENTION

The present invention relates to a semi-aqueous stripping and cleaning compositions and the methods using same. The composition comprises of aminobenzenesulfonic acid, a water miscible organic solvent and water.

In one embodiment, the semi-aqueous stripping and cleaning composition comprises
  a. from 0.5% to 10% of an aminobenzenesulfonic acid or its corresponding salt,
  b. from 30% to 90% of a water miscible organic solvent, and from 5% to 70% water.

In another embodiment, a method of removing photoresist, etch and/or ash residue, or contaminants from a semiconductor substrate, comprises:
  contacting the semiconductor substrate with a composition comprising:
    a. from 0.5% to 10% of an aminobenzenesulfonic acid or its corresponding salt,
    b. from 30% to 90% of a water miscible organic solvent, and
    c. from 5% to 70% water;
  for a period of time sufficient to substantially remove the photoresist, etch and/or ash residue or contaminants.

For the composition and the method in the above embodiments, the aminobenzenesulfonic acid or its corresponding salt, is selected from the group consisting of 2-aminobenzenesulfonic acid, 3-aminobenzenesulfonic acid, 4-aminobenzenesulfonic acid, and mixtures thereof.

In another embodiment, the semi-aqueous stripping and cleaning composition comprises
  a. from 0.5% to 10% of 2-aminobenzenesulfonic acid or its corresponding salt,
  b. from 30% to 90% of a water miscible organic solvent, and
  c. from 5% to 70% water.

Yet, in another embodiment, a method of removing photoresist, etch and/or ash residue, or contaminants from a semiconductor substrate, comprises:
  contacting the semiconductor substrate with a composition comprising:
    a. from 0.5% to 10% of 2-aminobenzenesulfonic acid or its corresponding salt,
    b. from 30% to 90% of a water miscible organic solvent, and
    c. from 5% to 70% water;
  for a period of time sufficient to substantially remove the photoresist, etch and/or ash residue or contaminants.

For the above embodiments, the water miscible organic solvent is selected from the group consisting of a glycol ether, a furfuryl alcohol, and mixtures thereof. More specifically, the water miscible organic solvent is selected from the group consisting of propylene glycol methyl ether (PGME), propylene glycol propyl ether (PGPE), tri(propylene glycol) monomethyl ether and 2-(2-butoxyethoxy)ethanol, tetrahydrofurfuryl alcohol (THFA), and mixtures thereof.

The compositions may further comprise up to 15% of a corrosion inhibitor selected from the group consisting of organic acid, organic acid salt, phenol, triazole, hydroxylamine derivative, fructose, ammonium sulfite, 2-aminopyrimidine, ammonium thiosulfate, glycine, tetramethylguanidine, iminodiacetic acid, dimethylacetoacetamide, and mixtures thereof.

The compositions may further comprise up to 10% a quaternary ammonium compound selected from the group consisting of tetramethylammonium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide, benzyltrimethylammonium hydroxide and mixtures thereof.

The compositions preferably have a pH from 6 to 11.

DETAILED DESCRIPTION OF THE INVENTION

The present invention provides a composition whose components are present in amounts that effectively remove residue from a substrate such as, for example, a semiconductor substrate. The present invention also provides a method for using the composition to remove residue from a substrate. In applications concerning semiconductor substrates, such residues include, for example, photoresists (hardened or otherwise), gap fill, bottom antireflective coating (BARC) and other polymeric materials (such as: C—F-containing polymers, low and high molecular weight polymers) and/or processing residues such as the residues generated by etching and ashing processes, inorganic compounds such as metal oxides, ceramic particles from chemical mechanical planarization (CMP) slurries and other inorganic etch residues, metal containing compounds such as, for example, organometallic residues and metal organic compounds. In one embodiment, compositions according to the present invention are particularly effective at removing silicon-containing BARC residues from a semiconductor substrate.

The residues are typically present in a substrate that may include metal, silicon, silicate and/or interlevel dielectric materials such as, for example, deposited silicon oxides and derivatized silicon oxides such as hydrogen silesquioxane (HSQ), methyl silsesquioxane (MSQ), field oxide (FOX), tetraethoxysilane (TEOS) and spin-on glass, chemical vapor deposited dielectric materials, low-k materials and/or high-k materials such as hafnium silicate, hafnium oxide, barium strontium titanate (BST), $TiO_2$, $TaO_5$, wherein both the residues and the metal, silicon, silicide, interlevel dielectric materials, low-k and/or high-k materials will come in contact with the cleaning composition. The compositions according to the present invention are compatible with such materials and, therefore, can be employed to selectively remove residues such as, for example, those described above, without significantly attacking the metal, silicon, silicon dioxide, interlevel dielectric materials, low-k and/or high-k materials. In certain embodiments, the substrate may contain a metal, such as, but not limited to, copper, cobalt, copper alloy, titanium, titanium nitride, tantalum, tantalum nitride, tungsten, and/or titanium/tungsten alloys.

During the manufacturing process, a photoresist layer is coated on the substrate. Using photolithographic process, a pattern is defined on to the photoresist layer. The patterned photoresist layer is thus subjected to plasma etch by which the pattern was transferred to the substrate. Etch residues were generated in the etch stage. Some of the substrates used in this invention were ashed while some were not ashed. When the substrates were ashed the main residues to be cleaned were etch and ash residues. If the substrates were not ashed, then the main residues to be cleaned or stripped were both etch residues and photoresists as well as highly crosslinked photoresists.

The composition disclosed herein is a semi-aqueous stripping and cleaning composition comprises an aminobenzenesulfonic acid or its corresponding salt; a water miscible organic solvent; and water. For this invention, "miscible" includes soluble.

In certain embodiments, the aminobenzenesulfonic acid is selected from the group consisting of 2-aminobenzenesulfonic acid (also known as orthanilic acid, aniline-2-sulfonic acid, aniline-o-sulfonic acid and oaminobenzenesulfonic), 3-aminobenzenesulfonic acid (also known as metanilic acid), 4-aminobenzenesulfonic acid (also known as sulfanilic acid), and mixtures thereof.

In certain embodiments, the water miscible organic solvent may be a glycol ether or a furfuryl alcohol. The glycol ethers may include glycol mono($C_1$-$C_6$)alkyl ethers and glycol di($C_1$-$C_6$)alkyl ethers, such as but not limited to, ($C_1$-$C_{20}$) alkane diols, ($C_1$-$C_6$)alkyl ethers, and ($C_1$-$C_{20}$)alkane diol di($C_1$-$C_6$)alkyl ethers. Examples of glycol ethers are ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monoethyl ether acetate, propylene glycol monomethyl ether, propylene glycol dimethyl ether, propylene glycol monobutyl ether, propylene glycol, monopropyl ether, dipropylene glycol monomethyl ether, dipropylene glycol monopropyl ether, dipropylene glycol monoisopropyl ether, dipropylene monobutyl ether, dipropylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy)ethanol. More typical examples of glycol ethers are propylene glycol monomethyl ether, propylene glycol monopropyl ether, tri(propylene glycol)monomethyl ether and 2-(2-butoxyethoxy)ethanol. An example of a furfuryl alcohol is Tetrahydrofurfuryl alcohol (THFA).

In certain embodiments, the composition may include 0.5% to about 15% by weight of one or more corrosion inhibitors. Any corrosion inhibitor known in the art for similar applications may be used. Corrosion inhibitors may be, for example, an organic acid, an organic acid salt, a phenol, a triazole, a hydroxylamine derivative or acid salt thereof. Examples of particular corrosion inhibitors include anthranilic acid, gallic acid, benzoic acid, isophthalic acid, maleic acid, fumaric acid, D,L-malic acid, malonic acid, phthalic acid, maleic anhydride, phthalic anhydride, benzotriazole (BZT), resorcinol, carboxybenzotriazole, dialkyl hydroxylamine derivative, lactic acid, citric acid, and the like. Further examples of corrosion inhibitors that may be used include catechol, pyrogallol, and esters of gallic acid. Particular dialkyl hydroxylamine derivatives that can be used include diethyl hydroxylamine. Yet other examples of suitable corrosion inhibitors include fructose, ammonium sulfite, 2-aminopyrimidine, ammonium thiosulfate, glycine, tetramethylguanidine, iminodiacetic acid, and dimethylacetoacetamide. In certain embodiments, the corrosion inhibitor may include a weak acid having a pH ranging from about 4 to about 7. Examples of weak acids include trihydroxybenzene, dihydroxybenzene, and/or salicylhydroxamic acid. In embodiments wherein the corrosion inhibitor is an organic acid, the organic acid may be the same as that used in the buffer solution.

In certain embodiments, the composition may include one or more quaternary ammonium compounds. Examples of suitable quaternary ammonium compounds include tetramethylammonium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide and benzyltrimethylammonium hydroxide. The quaternary ammonium compounds are present in an amount ranging from about 0.5% to about 10% or from about 5% to about 10% by weight.

In certain embodiments, the composition may optionally include a fluoride ion source typically in an amount of from about 0.1% to about 10% by weight, or from about 5 to about 10% by weight. Examples of such compounds include ammonium fluoride, tetramethyl ammonium fluoride, tetraethyl ammonium fluoride, tetrabutyl ammonium fluoride, and mixtures thereof. Still further examples of fluoride ion sources include fluoroboric acid, hydrofluoric acid, fluoroborates, fluoroboric acid, tetrabutylammonium tetrafluoroborate, aluminum hexafluoride, and choline fluoride.

In certain embodiments, the compositions comprise from 0.5% to 10% of a aminobenzenesulfonic acid or its corresponding salt; from 30% to 90% of a organic solvent, and from 5% to 70% water wherein the composition has a pH from 6 to 11.

In one particular embodiment, the composition is comprised of 0.5% to 10% of 2-aminobenzenesulfonic acid; from 30% to 90% of, and from 5% to 70% water.

The compositions preferably have a pH from 6 to 11.

Compositions of the Substrate

Each substrate used in the present Examples consist of a top layer of post-etched resist followed by a BARC layer. The BARC layer is in turn on top a hard mask followed by a low-k dielectric. Examples of hard mask materials are typically but not limited to titanium and titanium nitride. For dual damascene substrate, the dielectric layer is followed by an etch stop which is in turn followed by a typically but not limited to copper layer.

Processing Conditions

Cleaning tests were run using 305 mL of the cleaning compositions in a 400 mL beaker with a ½" round Teflon stir bar set at 600 rpm. The cleaning compositions were heated to the desired temperature indicated below on a hot plate if necessary. Wafer segments approximately ½"×½" in size were immersed in the compositions under the following set of conditions:
  30 minutes @50° C.

The segments were then rinsed for 3 minutes in a deionized (DI) water overflow bath and subsequently dried using filtered nitrogen. They were then analyzed for cleanliness using scanning electron microscope (SEM) microscopy.

Working Examples

The following examples are provided for the purpose of further illustrating the present invention but are by no means intended to limit the same.

In the following examples, all amounts were given in weight percent and add up to 100 weight percent. The compositions disclosed herein were prepared by mixing the components together in a vessel at room temperature until all solids have dissolved. Examples of certain compositions disclosed herein are set forth in Table I.

The following are the acronyms used in Table I:
PGME=Propylene glycol methyl ether
THFA=Tetrahydrofurfuryl alcohol
PGPE=Propylene glycol propyl ether
DEHA=Diethyl hydroxylamine
2-ASA=2-aminobenzenesulfonic acid
3-ASA=3-aminobenzenesulfonic acid
4-ASA=4-aminobenzenesulfonic acid
p-TSA=p-Toluenesulfonic acid
MSA=Methanesulfonic acid
TMAH=Tetramethylammonium hydroxide
TMAF=Tetramethylammonium fluoride
Amm. Sulfite=Ammonium sulfite

TABLE I

| EXEMPLARY COMPOSITIONS | | |
|---|---|---|
| EXAMPLE A | EXAMPLE B | EXAMPLE C |
| PGME 46 | PGME 54.8 | PGME 37.7 |
| DI Water 44.4 | DI water 39.5 | DI water 51 |
| 2-ASA 2 | 2-ASA 2 | 2-ASA 7 |
| TMAH 7 | TMAH 2.1 | TMAH 3.7 |
| TMAF 0.6 | TMAF 0.6 | TMAF 0.6 |
| | 2-aminopyrimidine 1 | |
| EXAMPLE D | EXAMPLE E | EXAMPLE F |
| PGME 59 | PGME 37 | PGME 10 |
| DI Water 30.9 | DI water 49.9 | DI water 49.4 |
| 2-ASA 2 | 2-ASA 2 | 2-ASA 2 |
| amm. Sulfite 1 | amm. Sulfite 2 | benzonic acid 1 |
| TMAH 6.5 | TMAH 7.5 | TMAH 7 |
| TMAF 0.6 | TMAF 0.6 | TMAF 0.6 |
| | 2-aminopyrimidine 1 | THFA 30 |
| EXAMPLE G | EXAMPLE H | EXAMPLE I |
| THFA 40 | PGME 33 | PGME 32.8 |
| DI water 49.4 | DI water 49.4 | DI water 51.2 |
| 2-ASA 2 | 2-ASA 2 | 2-ASA 2.2 |
| Benzoic acid 1 | Malonic acid 3 | Citric acid 0.9 |
| TMAH 7 | TMAH 7 | TMAH 7.3 |
| TMAF 0.6 | TMAF 0.6 | TMAF 0.6 |
| | | DEHA 5 |
| EXAMPLE J | EXALMPLE K | EXAMPLE L |
| PGME 32.8 | PGME 32.8 | PGME 32.8 |
| DI water 51.2 | DI water 51.2 | DI water 51.2 |
| 4-ASA 2.2 | p-TSA 2.2 | MSA 2.2 |
| Citric acid 0.9 | Citric acid 0.9 | Citric acid 0.9 |
| TMAH 7.3 | TMAH 7.3 | TMAH 7.3 |
| TMAF 0.6 | TMAF 0.6 | TMAF 0.6 |
| DEHA 5 | DEHA 5 | DEHA 5 |
| EXAMPLE M | EXAMPLE N | EXAMPLE O |
| PGME 40 | PGME 67.6 | PGPE 32.8 |
| DI water 52.1 | DI water 20.2 | DI water 51.2 |
| 2-ASA 2 | TBAH 1.1 | 2-ASA 2.2 |
| Citric acid 0.9 | 2-ASA 2 | Citric acid 0.9 |
| DEHA 5 | DEHA 5 | TMAH 7.3 |
| | TEA 1.1 | TMAF 0.6 |
| | Resorcinol 3 | DEHA 5 |
| EXAMPLE P | EXALMPLE Q | EXAMPLE R |
| PGME 32.8 | PGME 32.8 | PGME 32.8 |
| DI water 46.7 | DI water 46.7 | DI water 46.7 |
| 2-ASA 2.2 | p-TSA 2.2 | MSA 2.2 |
| Citric acid 6 | Citric acid 6 | Citric acid 6 |
| TMAH 7.3 | TMAH 7.3 | TMAH 7.3 |
| DEHA 5 | DEHA 5 | DEHA 5 |
| EXAMPLE S | | EXAMPLE T |
| PGME 32.8 | | PGME 32.8 |
| DI water 46.7 | | DI water 46.7 |
| 3-ASA 2.2 | | 4-ASA 2.2 |
| Citric acid 6 | | Citric acid 6 |
| TMAH 7.3 | | TMAH 7.3 |
| DEHA 5 | | DEHA 5 |

The cleaning effect of the exemplary compositions was shown in Table II.

TABLE II

Cleaning effect data of the exemplary compositions

| | BARC | | Photo-resist |
|---|---|---|---|
| Formulations | 248 nm | 193 nm | 248 nm |
| Example A | ✓ | X | ✓- |
| Example B | ✓ | X | ✓- |
| Example C | ✓ | ✓- | ✓ |
| Example D | ✓ | ✓- | ✓- |
| Example E | ✓- | ✓- | ✓- |
| Example F | ✓ | ✓- | ✓- |
| Example G | ✓ | ✓- | ✓- |
| Example H | ✓ | ✓- | X |
| Example I | ✓ | X | X |
| Example J | ✓ | X | ✓ |
| Example K | ✓ | X | ✓ |

TABLE II-continued

Cleaning effect data of the exemplary compositions

| Formulations | BARC | | Photo-resist |
| --- | --- | --- | --- |
| | 248 nm | 193 nm | 248 nm |
| Example L | ✓ | X | ✓ |
| Example M | ✓ | ✓- | ✓ |
| Example N | ✓ | X | ✓- |
| Example O | ✓ | ✓- | ✓- |
| Example P | ✓ | ✓ | ✓ |
| Example Q | ✓- | X | X |
| Example R | ✓ | X | ✓- |
| Example S | ✓- | ✓- | ✓- |
| Example T | ✓ | X | ✓- |

✓ = cleaned;
✓- = partially cleaned;
X = not cleaned

As shown in Table I, the only variable component for the set of Examples P to T was the different sulfonic acid used in the compositions. All the aminobenzenesulfonic acids were having some cleaning effect as shown in Table II. It appeared that the position of the sulfonate functional group was playing a role in cleaning efficiency. As shown in the structures below, when the sulfonate group was in the ortho position as in 2-aminobenzenesulfonic acid (2-ASA, Example P), the composition was able to clean the substrate and remove the BARC material at the same time. However, when the sulfonate group was in the meta- and para-positions as in 3-aminobenzenesulfonic acid (3-ASA) and 4-aminobenzenesulfonic acid (4-ASA) respectively (Example S and Example T), these compositions were less effective for the cleaning, some were not successful in cleaning the substrates. The weak cleaning effect was also shown in other sulfonate compounds, p-Toluenesulfonic acid (p-TSA) and Methanesulfonic acid (MSA) they were not successful in cleaning the substrate.

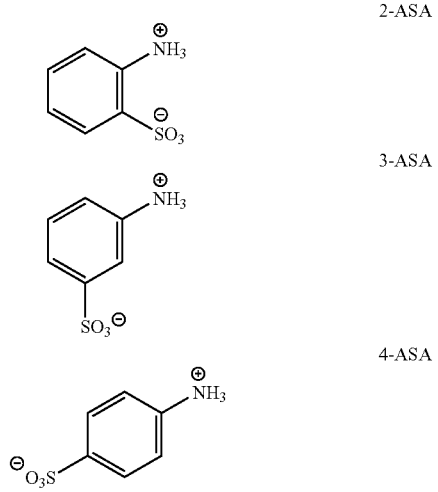

The beneficial cleaning effects of the compositions containing 2-ASA appeared to be reduced when a fluoride was added to the compositions. The weakened cleaning effect was prominent when Example P and Example I were compared. Example P and Example I each contained 2-ASA, but Example I had a fluoride in addition to all the components that Example P had. Example P was able to clean the substrate and remove the BARC material at the same time, while Example I was clearly not able to clean the substrate and remove the BARC material at the same time (shown in Table II).

Diethyl hydroxylamine (and other hydroxylamine derivatives) were being used as a corrosion inhibitor for copper. Ordinarily, hydroxylamine derivative are not considered as compatible with copper because of their ability to etch copper but in those compositions they were used to prevent copper corrosion.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The invention claimed is:

1. A semi-aqueous stripping and cleaning composition, comprising:
   a. from 0.5% to 10% of an aminobenzenesulfonic acid or its corresponding salt,
   b. from 30% to 90% of a water miscible organic solvent, and
   c. from 5% to 70% of water;
      wherein the composition has a pH from 6 to 11.

2. The composition as claimed in claim 1, wherein the aminobenzenesulfonic acid is selected from the group consisting of 2-aminobenzenesulfonic acid, 3-aminobenzenesulfonic acid, 4-aminobenzenesulfonic acid and mixtures thereof.

3. The composition as claimed in claim 1, wherein the water miscible organic solvent is selected from the group consisting of a glycol ether, a furfuryl alcohol, and mixtures thereof.

4. The composition as claimed in claim 3, wherein the water miscible organic solvent is selected from the group consisting of propylene glycol methyl ether (PGME), propylene glycol propyl ether (PGPE), tri(propylene glycol) monomethyl ether, 2-(2-butoxyethoxy)ethanol, tetrahydrofurfuryl alcohol (THFA), and mixtures thereof.

5. The composition as claimed in claim 1, wherein the composition further comprises from 0.5% to 15% of a corrosion inhibitor selected from the group consisting of organic acid, organic acid salt, phenol, triazole, hydroxylamine derivative, fructose, ammonium sulfite, 2-aminopyrimidine, ammonium thiosulfate, glycine, tetramethylguanidine, iminodiacetic acid, dimethylacetoacetamide, and mixtures thereof.

6. The composition as claimed in claim 1, wherein the composition further comprises from 0.5% to 10% of a quaternary ammonium compound selected from the group consisting of tetramethylammonium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide, benzyltrimethylammonium hydroxide and mixtures thereof.

7. A semi-aqueous stripping and cleaning composition, comprising:
   a. from 0.5% to 10% of 2-aminobenzenesulfonic acid or its corresponding salt, b. from 30% to 90% of a water miscible organic solvent, and c. from 5% to 70% of water;

wherein the composition has a pH from 6 to 11.

8. The composition as claimed in claim 7, wherein the water miscible organic solvent is selected from the group consisting of a glycol ether, a furfuryl alcohol, and mixtures thereof.

9. The composition as claimed in claim 7, wherein the composition further comprises from 0.5% to 15% of a corrosion inhibitor selected from the group consisting of organic acid, organic acid salt, phenol, triazole, hydroxylamine derivative, fructose, ammonium sulfite, 2-aminopyrimidine, ammonium thiosulfate, glycine, tetramethylguanidine, iminodiacetic acid, dimethylacetoacetamide, and mixtures thereof.

10. The composition as claimed in claim 7, wherein the composition further comprises from 0.5% to 10% of a quaternary ammonium compound selected from the group consisting of tetramethylammonium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide, benzyltrimethylammonium hydroxide and mixtures thereof.

11. A method of removing photoresist, etch and/or ash residue, or contaminants from a semiconductor substrate, comprising:

contacting the semiconductor substrate with a composition, comprising:

a. from 0.5% to 10% of an aminobenzenesulfonic acid or its corresponding salt, b. from 30% to 90% of a water miscible organic solvent, and c. from 5% to 70% of water;

wherein the composition has a pH from 6 to 11;

for a period of time sufficient to substantially remove the photoresist, etch and/or ash residue or contaminants.

12. The method as claimed in claim 11, wherein the aminobenzenesulfonic acid is selected from the group consisting of 2-aminobenzenesulfonic acid, 3-aminobenzenesulfonic acid, 4-aminobenzenesulfonic acid and mixtures thereof.

13. The method as claimed in claim 11, wherein the water miscible organic solvent is selected from the group consisting of a glycol ether, a furfuryl alcohol, and mixtures thereof.

14. The method as claimed in claim 13, wherein the water miscible organic solvent is selected from the group consisting of propylene glycol methyl ether (PGME), propylene glycol propyl ether (PGPE), tri(propylene glycol) monomethyl ether, 2-(2-butoxyethoxy)ethanol, tetrahydrofurfuryl alcohol (THFA), and mixtures thereof.

15. The method as claimed in claim 11, wherein the composition further comprises from 0.5% to 15% of a corrosion inhibitor selected from the group consisting of organic acid, organic acid salt, phenol, triazole, hydroxylamine derivative, fructose, ammonium sulfite, 2-aminopyrimidine, ammonium thiosulfate, glycine, tetramethylguanidine, iminodiacetic acid, dimethylacetoacetamide, and mixtures thereof.

16. The method as claimed in claim 11, wherein the composition further comprises from 0.5% to 10% of a quaternary ammonium compound selected from the group consisting of tetramethylammonium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide, benzyltrimethylammonium hydroxide and mixtures thereof.

17. A method of removing photoresist, etch and/or ash residue, or contaminants from a semiconductor substrate, comprising:

contacting the semiconductor substrate with a composition, comprising:

a. from 0.5% to 10% of 2-aminobenzenesulfonic acid or its corresponding salt, b. from 30% to 90% of a water miscible organic solvent, and c. from 5% to 70% of water;

wherein the composition has a pH from 6 to 11;

for a period of time sufficient to substantially remove the photoresist, etch and/or ash residue or contaminants.

18. The method as claimed in claim 17, wherein the water miscible organic solvent is selected from the group consisting of a glycol ether, a furfuryl alcohol, and mixtures thereof.

19. The method as claimed in claim 17, wherein the composition further comprises from 0.5% to 15% of a corrosion inhibitor selected from the group consisting of organic acid, organic acid salt, phenol, triazole, hydroxylamine derivative, fructose, ammonium sulfite, 2-aminopyrimidine, ammonium thiosulfate, glycine, tetramethylguanidine, iminodiacetic acid, and dimethylacetoacetamide, and mixtures thereof.

20. The method as claimed in claim 17, wherein the composition further comprises from 0.5% to 10% of a quaternary ammonium compound selected from the group consisting of tetramethylammonium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide, benzyltrimethylammonium hydroxide and mixtures thereof.

* * * * *